(12) United States Patent
Chu et al.

(10) Patent No.: US 7,154,801 B1
(45) Date of Patent: Dec. 26, 2006

(54) PROTECTION CIRCUIT OF A MEMORY MODULE AND THE METHOD THEREOF

(75) Inventors: Yi-Shan Chu, Science-Based Industrial Park (TW); Ju-Lin Chia, Science-Based Industrial Park (TW); Da-Chun Wei, Science-Based Industrial Park (TW)

(73) Assignee: Leadtrend Technology Corp. (TW)

( * ) Notice: Subject to any disclaimer, the term of this patent is extended or adjusted under 35 U.S.C. 154(b) by 0 days.

(21) Appl. No.: 11/207,789

(22) Filed: Aug. 22, 2005

(30) Foreign Application Priority Data

Jun. 29, 2005 (TW) .............................. 94121921 A

(51) Int. Cl.
  *G11C 5/14* (2006.01)
(52) U.S. Cl. ........................................ 365/226; 365/228
(58) Field of Classification Search ................. 365/226, 365/189.07, 228, 189.08
See application file for complete search history.

(56) References Cited

U.S. PATENT DOCUMENTS 5,789,971 A * 8/1998 Colletti et al. .............. 327/541
6,052,022 A * 4/2000 Lee ............................. 327/589
6,781,912 B1 * 8/2004 Taub ........................... 365/226

* cited by examiner

*Primary Examiner*—Anh Phung
(74) *Attorney, Agent, or Firm*—Harness, Dickey & Pierce, P.L.C.

(57) ABSTRACT

A protection circuit of the memory module and method thereof are provided. The protection circuit includes: a first voltage comparing unit, which compares a reference voltage signal with a voltage level signal to output a first driving signal; a transistor switch, which is connected among the output terminal of the first voltage comparing unit and the input terminal of the second voltage comparing unit and a power end, wherein the voltage level signal and the threshold voltage signal is compared by the second voltage comparing unit so as to output a second driving signal to a logical algorithm unit, and a logical algorithm is conducted between the second driving signal and system enable signal to output a third driving signal; and a soft start enable unit for receiving the third driving signal so as to enable a soft start process.

9 Claims, 5 Drawing Sheets

PROTECTION CIRCUIT OF A MEMORY MODULE AND THE METHOD THEREOF

This Non-provisional application claims priority under 35 U.S.C. § 119(a) on Patent Application No(s). 094121921 filed in Taiwan on Jun. 29, 2005, the entire contents of which are hereby incorporated by reference.

BACKGROUND OF THE INVENTION

1. Field of Invention

The present invention relates to a protection circuit, in particular, to a protection circuit of the memory module and the method thereof.

2. Related Art

In a computer system, a memory module is responsible for storing the data to be processed and provides it to the central processing unit to process. Currently, most memory module slot designs are provided with fool-proof mechanisms, that are having a projection thereon to fit a recess on said memory module, such that said memory module may only be inserted into the slot along a certain inserting direction. However, in some using cases, there are still occasions where the user may insert the memory module in a wrong way (i.e., the inversely inserting state). At this time, if the power is supplied to the memory module, the memory module would be burnt.

Therefore, in a memory power supply circuit, a corresponding protection circuit will be designed to cut the power supply to the memory module when said memory module is inserted wrongly, so as to protect such memory module. At present, the under voltage protection (UVP) mechanism is designed in a power supply chip circuit of the memory module. When the supply voltage (VDDQ) is reduced to a certain proportion (generally, 80% of the preset value) due to an over current, said under voltage protection mechanism is triggered, and the power supply chip outputs a low level signal, which forces the transistor switch connected between the power and the memory module to be off, so as to protect said memory module.

If the computer is booted when the memory module is in a normal inserting state, the memory power supply circuit will undergo a soft start process (practically being about 30 ms~60 ms), and raise the supply voltage VDDQ and the terminal voltage VTT to a preset value, to supply power to the memory module. However, the under voltage protection mechanism is not allowed to enable until the soft start process is completed.

If the computer is booted when the memory module is in the inversely inserting state, which is equivalent to the case where the computer is booted when the supply voltage VDDQ is shorted to ground, the above memory power supply circuit still has to undergo a soft start process, and tries to raise the supply voltage VDDQ and the terminal voltage VTT to the preset value. Said under voltage protection mechanism is then allowed to enable after the soft start process is completed. Therefore, the reaction in this protection measure is too slow, such that the memory module has already been burned due to over current passing through, usually before said under voltage protection mechanism is enabled while in the soft start process. Thus, the memory module can hardly be protected efficiently.

Since said member module belongs to a high unit price product, how to provide a protection circuit of the memory module and the method thereof is one of the problems to be solved by the researchers.

SUMMARY OF THE INVENTION

In view of the above problems, a primary object of the present invention is to provide a protection circuit of a memory module. Power is provided to the memory module after determining the inserting state of the memory module, thereby protecting the memory module.

Therefore, in order to achieve the above object, the protection circuit of the memory module disclosed in the invention comprises: a first voltage comparing unit, a transistor switch, a second voltage comparing unit, a logical algorithm unit and a soft start enable unit.

The first voltage comparing unit is used for comparing a reference voltage signal with a voltage level signal so as to output a first driving signal.

The transistor switch is connected among the output terminal of the first voltage comparing unit and the input terminal of the second voltage comparing unit and a power end, and is triggered to be on by a first driving signal, wherein, said transistor switch is consisted of metal semiconductor transistor switches.

The second voltage comparing unit is used for comparing the voltage level signal with the threshold voltage signal after the transistor switch is on, so as to output a second driving signal.

The logical algorithm unit is used to carry a logical algorithm between the second driving signal and the enable signal, to output a third driving signal.

After receiving the third driving signal, the soft start enable unit determines whether to enter a soft start process.

It further comprises a current source and a capacitance. The current source is connected with the transistor switch, while the capacitance has one end connected to the transistor switch, and the other end connected to the ground. The current source charges the capacitance to form a voltage level signal. When the transistor switch is on, the power end supplies a power to the memory module; and when the transistor switch is off, the power end cannot supply a power to the memory module.

In order to achieve the above object, the method for protecting the memory module disclosed in the invention comprises the following steps: first, providing a current source to the capacitance connected to the slot loops of the memory module; next, setting a voltage comparator having a threshold voltage signal input and connected to said capacitance; charging the capacitance through said current source to form a voltage level signal; and determining whether to activate the soft start process after comparing the voltage level signal of the capacitance with the threshold voltage signal through the threshold voltage comparator.

Wherein, when the memory module is inversely inserted to the slot loop of the memory module, the transistor switch is off, so that the power cannot be supplied to the memory module.

The power is provided to the memory module through determining the memory module is in the normal inserting state by the protection circuit of the memory module and the method thereof, thereby protecting the memory module from power supply when in the inversely inserting state, which otherwise may cause the problem of burning the memory module.

The detail description of the features and details of the present invention will be given by the embodiments with reference to the figures as follows.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, and thus are not limitative of the present invention, and wherein.

DETAILED DESCRIPTION OF THE INVENTION

Figure 1:
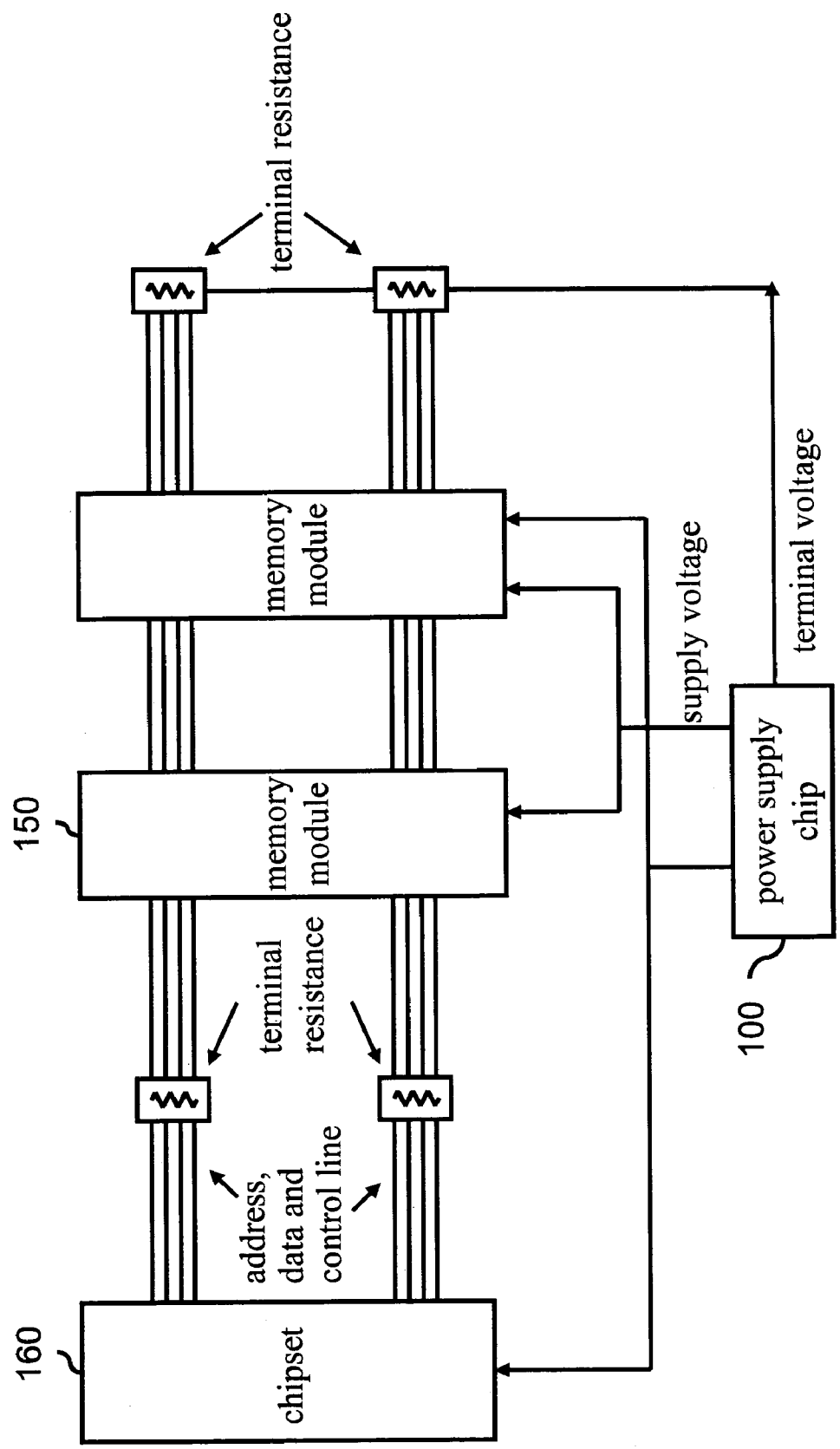
FIG. 1 is a system block diagram of the present invention.

Referring to FIG. 1, which is a system block diagram of the memory module of the present invention, the memory module comprises: a power supply chip 100, a memory module 150 and a chipset 160.

The power supply chip 100 is used for providing the power (for example, supply voltage VDDQ and terminal voltage VTT) required by the operation of the memory module 150 and the chipset 160.

Memory module 150 provides the function of registering the data to be processed by the computer system. And the memory module 150 may be consisted of a double data-rate synchronous DRAM (DDR) or a synchronous dynamic random access memory (SDRAM). If the memory module 150 is DDR, its supply voltage VDDQ is generally 2.5 V, and its terminal voltage VTT is 1.25 V. If the memory module 150 is SDRAM, its supply voltage VDDQ is generally 1.8 V, and its terminal voltage VTT is 0.9 V.

Chipset 160 is connected with the memory module 150 through a bus (for example, address, data and control line), so as to be responsible for the signal transmission operation of several primary modules (for example, a central processing unit, a memory module, a peripheral controller interface and an accelerated graphics interface) in the computer system, whereas the chipset 160 may be consisted of north bridge chips.

Figure 2A:
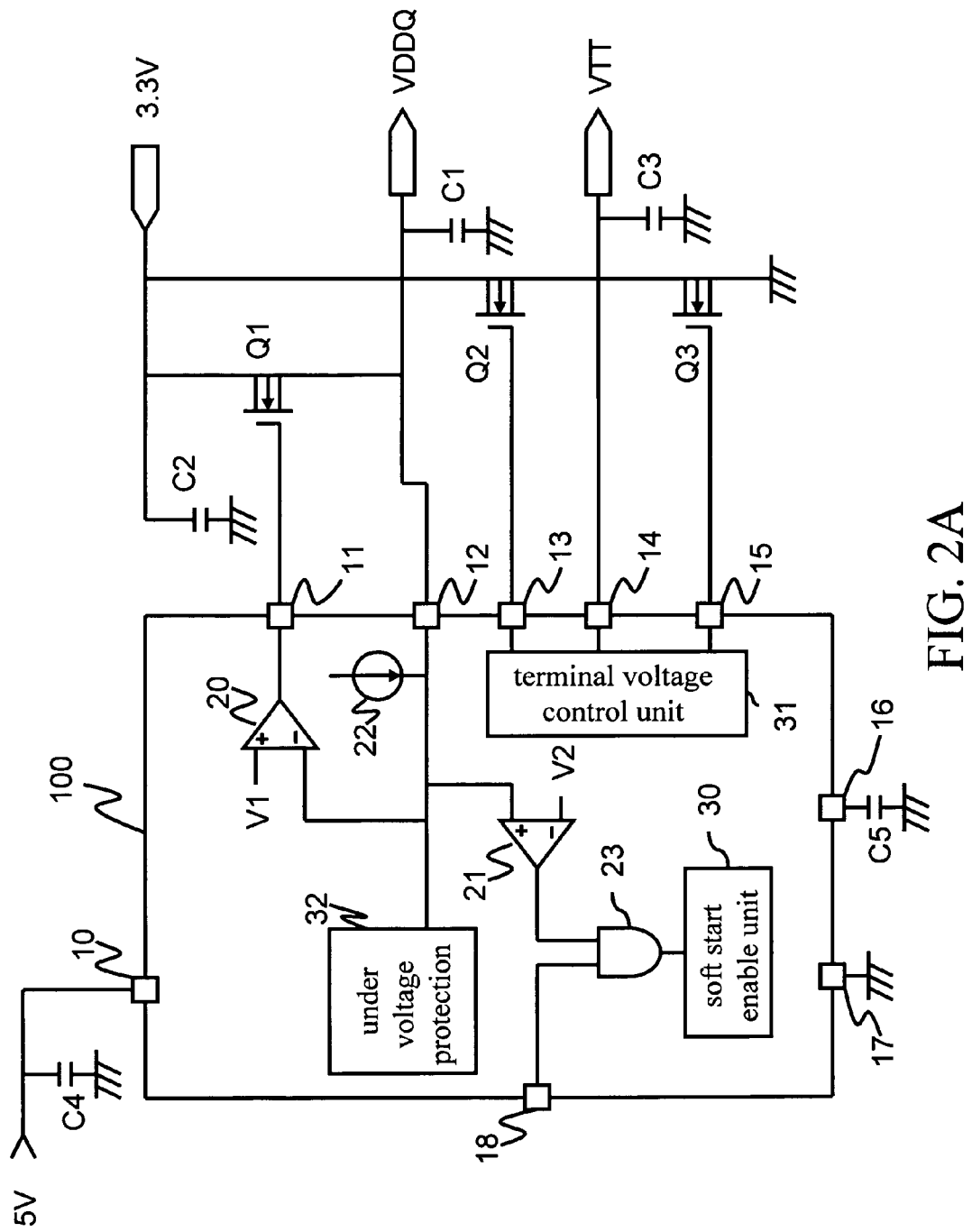
FIG. 2A is a circuit block diagram of a first embodiment of the present invention.

With reference to FIG. 2A, which is a circuit block diagram of a first embodiment of the present invention. It comprises: a first voltage comparing unit 20, a first transistor switch Q1, a second voltage comparing unit 21, a current source 22, a logical algorithm unit 23 and a soft start enable unit 30.

The first input terminal of the first voltage comparing unit 20 receives the reference voltage signal V1 (i.e., the preset voltage of the supply voltage VDDQ, such as 2.5V), and the second input terminal of the first voltage comparing unit 20 is connected with the under voltage protection unit 32, to compare the voltage level error of the reference voltage signal V1 and the supply voltage VDDQ, so that a first driving signal is output and the supply voltage VDDQ is maintained at the preset value, wherein the first voltage comparing unit 20 is consisted of an error amplifier.

The gate of the first transistor switch Q1 is connected with an endpoint 11 which is connected with the output terminal of the first voltage comparing unit 20. The drain of the first transistor switch Q1 is connected with one end of a second capacitance C2, the other end of which is connected with the ground. And the source of the first transistor switch Q1 is connected with an endpoint 12 which is connected with the first input terminal of the second voltage comparing unit 21. The first transistor switch Q1 is triggered to be on by the first driving signal, wherein said first transistor switch Q1 can be consisted of the N-type, P-type metal semiconductor transistor switches or other types of transistor switches. FIG. 2A takes N-type metal semiconductor transistor switch for example.

The first input terminal of the second voltage comparing unit 21 is connected with the endpoint 12, and the second input terminal of the second voltage comparing unit 21 receives a threshold voltage signal V2, so as to compare the supply voltage signal VDDQ with the lower level threshold voltage signal V2 (such as 0.15 V), so that a second driving signal is output, wherein the second voltage comparing unit 21 is consisted of comparators.

One end of the current source 22 is connected with the endpoint 12, so as to provide a micro-current (for example, 10 mA of such micro-current will not damage the memory module 150), so that said first capacitance C1 is charged.

The first input terminal of the logical algorithm unit 23 is connected to an endpoint 18 which receives a system enable signal, and the second input terminal of the logical algorithm unit 23 is connected to the output terminal of the second voltage comparing unit 21. A logical algorithm is conducted between the second driving signal and the enable signal, so as to output a third driving signal. And the logical algorithm unit 23 may be consisted of AND gates.

The soft start enable unit 30 is connected to the output terminal of the logical algorithm unit 23, to receive the third driving signal, so that the soft start process of the power chip 100 is enabled.

Further, the connection relationship between some endpoints of the power supply chip 100 is illustrated as follows. One end of the fourth capacitance C4 is connected to a power of 5 V, and the other end is connected to an endpoint 10. The drain of the second transistor switch Q2 is connected to a power of 3.3V, its gate is connected to an endpoint 13, and its source is connected to an endpoint 14, wherein said second transistor switch Q2 may be consisted of the N-type, P-type metal semiconductor transistor switches or other types of transistor switches. FIG. 2A takes N-type metal semiconductor transistor switch for example. The drain of the third transistor switch Q3 is connected to an endpoint 14, its gate is connected to an endpoint 15, and its source is connected to the ground, wherein said third transistor switch Q3 may be consisted of the N-type, P-type metal semiconductor transistor switches or other types of transistor switches. FIG. 2A takes N-type metal semiconductor transistor switch for example. One end of the third capacitance C3 is connected to an endpoint 14, and the other end is connected to the ground; one end of the fifth capacitance C5 is connected to an endpoint 16, and the other end is connected to the ground; and an endpoint 17 is connected to the ground.

The following illustrates the operation of the protection circuit. When the memory module 150 is at a normal inserting state and the endpoint 18 receives a system enable signal, the memory power circuit is activated. At this time, the first capacitance C1 is charged by the power current source 22, so that the first capacitance C1 forms a voltage level signal and provides a voltage level signal to the first input terminal of the second voltage comparing unit 21, and the second voltage comparing unit 21 compares the threshold voltage signal V2 with the voltage level signal of the first capacitance C1. When the voltage level signal of the first capacitance C1 is higher than the threshold voltage signal V2 of the first capacitance C1, the second driving signal is output. After the first and second input terminal of the logical algorithm unit 23 have received the enable signal and the second driving signal respectively and have conducted logical algorithm, the third driving signal is output to the soft start enable unit 30. Next, said soft start enable unit 30 enables the soft start process to be triggered and activated. At this time, said first voltage comparing unit 20 outputs the first driving signal, which causes the first transistor Q1 to be on, and raises the supply voltage VDDQ and the terminal voltage VTT to a preset value, and thereby a soft start process is completed. The power supply chip 100 outputs the supply voltage VDDQ and the terminal voltage VTT.

When the endpoint 18 receives a system enable signal and the memory module 150 is inserted in an abnormal state (i.e., inversely inserting state), the endpoint 12 is shorted to the ground. At this time, said current source 22 cannot be filled to a given voltage level (V2), therefore, the second voltage comparing unit 21 outputs a low level signal. After the first and second input terminal of the logical algorithm unit 23 have received the enable signal and the second driving signal respectively and have conducted logical algorithm, the low level is output to the soft start enable unit 30. Whereas, said soft start enable unit 30 will not enable the soft start process to be triggered, said first transistor switch Q1 is off, so that the power supply chip 100 will not output the supply voltage VDDQ and the terminal voltage VTT, thereby to protect the memory module 150. In this protection manner, the power supply chip 100 is not necessary to use additional pins, the structure of the protection line is simple, and it is not necessary to increase additional costs.

Figure 2B:
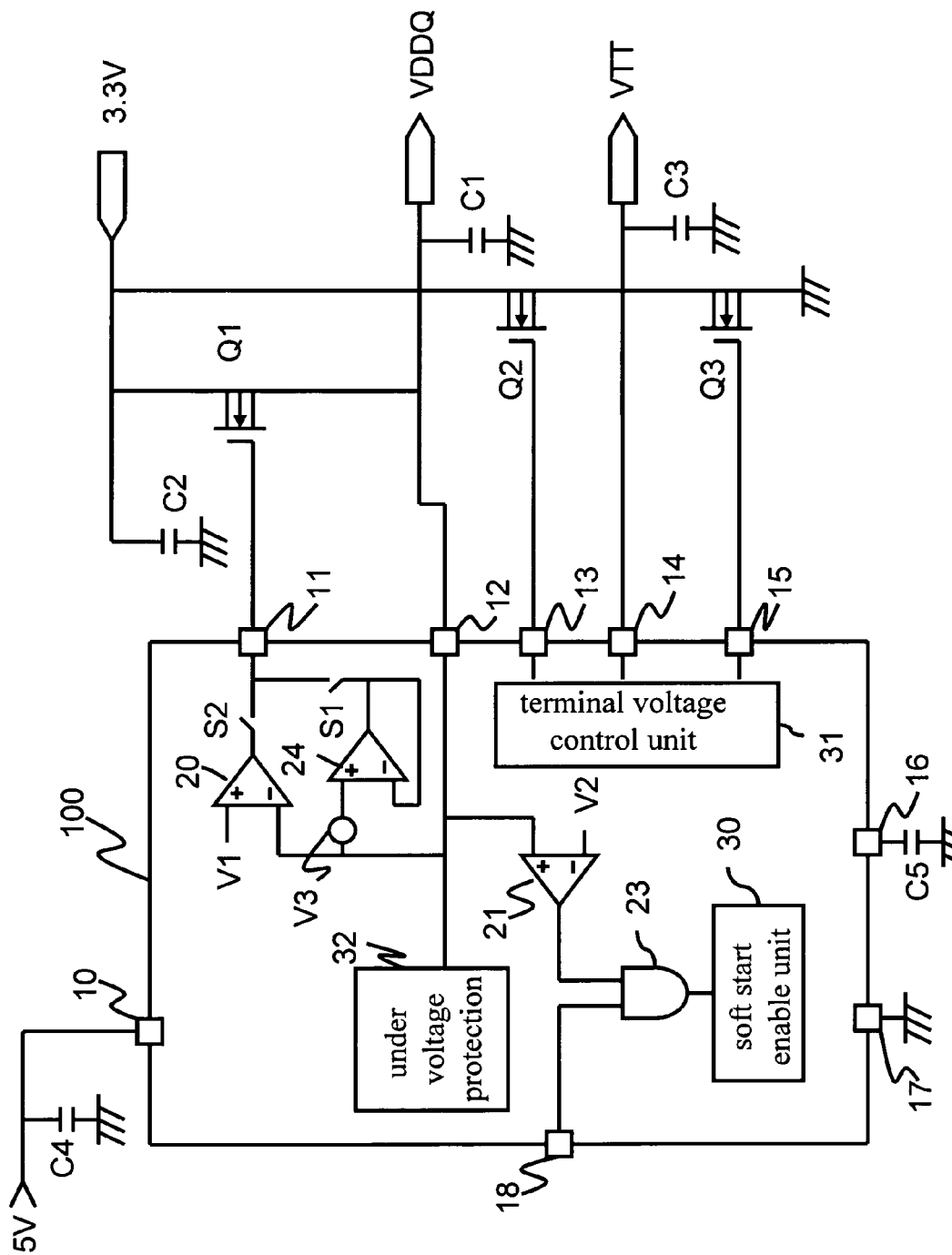
FIG. 2B is a circuit block diagram of a second embodiment of the present invention.

With reference to FIG. 2B, which is another embodiment of the present invention. It comprises: a third voltage comparing unit 24 and a reference voltage signal V3. The rest is the same as the first embodiment, and no further details will be given here.

The first input terminal of the third voltage comparing unit 24 receives a reference voltage signal V3, and the second input terminal is connected to its output terminal.

One end of a switch S1 is connected to the output terminal of the third voltage comparing unit 24, and the other end is connected to the endpoint 11.

One end of a switch S2 is connected to the output terminal of the first voltage comparing unit 20, and the other end is connected to the endpoint 11.

The difference between FIG. 2B and FIG. 2A resides in that FIG. 2A generates a current source actively to charge the capacitance through the endpoint 12, but in FIG. 2B, the capacitance is charged by the signal through controlling the first transistor switch Q1. The rest is the same as the first embodiment, and no further details will be given here.

Figure 3:
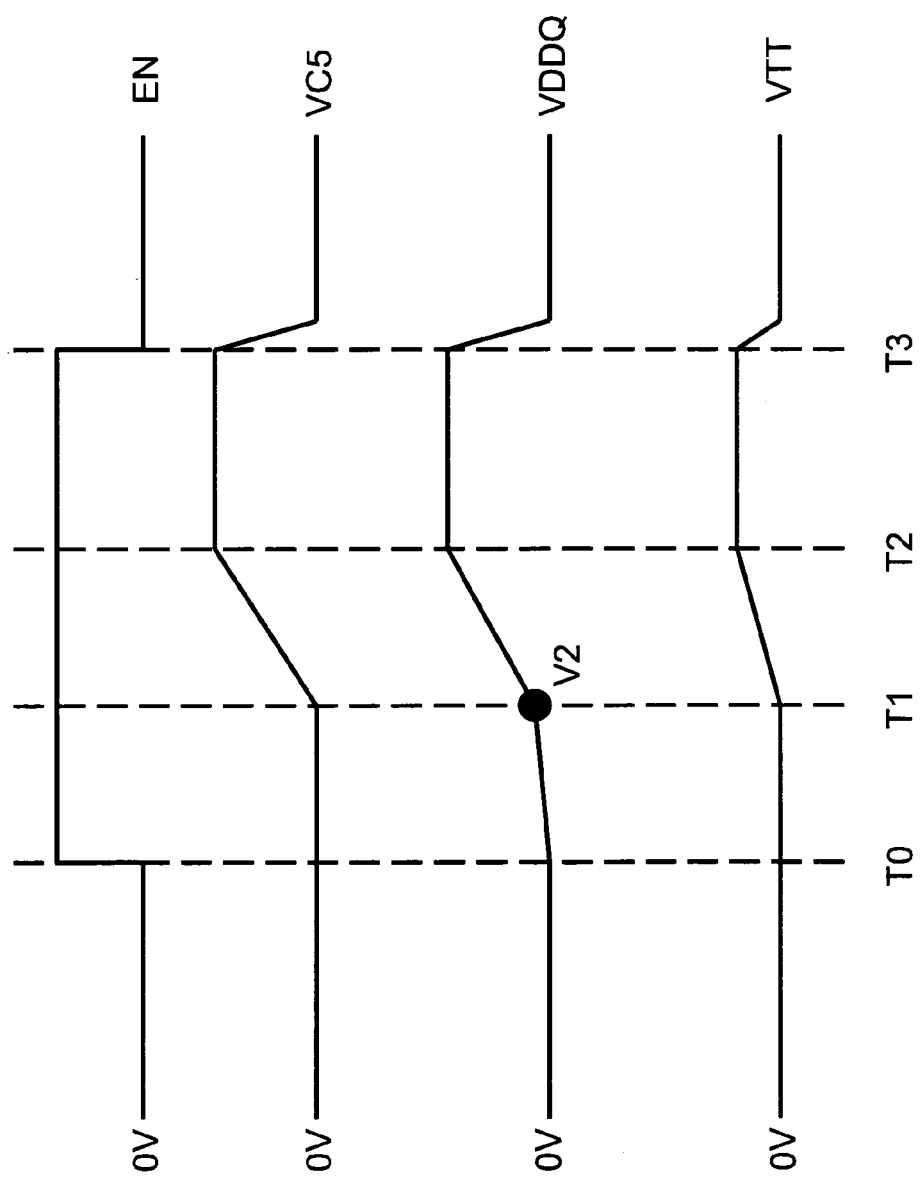
FIG. 3 is a schematic timing diagram of the first embodiment of the present invention.

With reference to FIG. 3, which is a schematic timing diagram of the first embodiment of the present invention, time point T1 is used for determining whether the memory module is in a normal inserting state or an abnormal inserting state. At the time point T0, the current source begins to charge the first capacitance C1 and raises the supply voltage VDDQ slowly. When the memory module 150 is in the normal inserting state, and the supply voltage VDDQ is raised to be higher than the threshold voltage signal V2 (for example, 0.15 V), the power supply chip 100 will stop charging the first capacitance C1. Then, the soft start enable unit 30 enables the soft start process to be triggered, so as to raise the supply voltage VDDQ and the terminal voltage VTT to a preset value.

When the memory module 150 is in an abnormal inserting state (that is, inversely inserting state), i.e. the supply voltage VDDQ end is shorted to the ground. Therefore, the supply voltage VDDQ cannot be higher than the threshold voltage V2, and the soft start enable unit 30 will not be operated, so that the power supply chip 100 cannot raise the voltage VDDQ and the terminal voltage VTT to a preset value, so as to protect the memory module 150.

Figure 4:
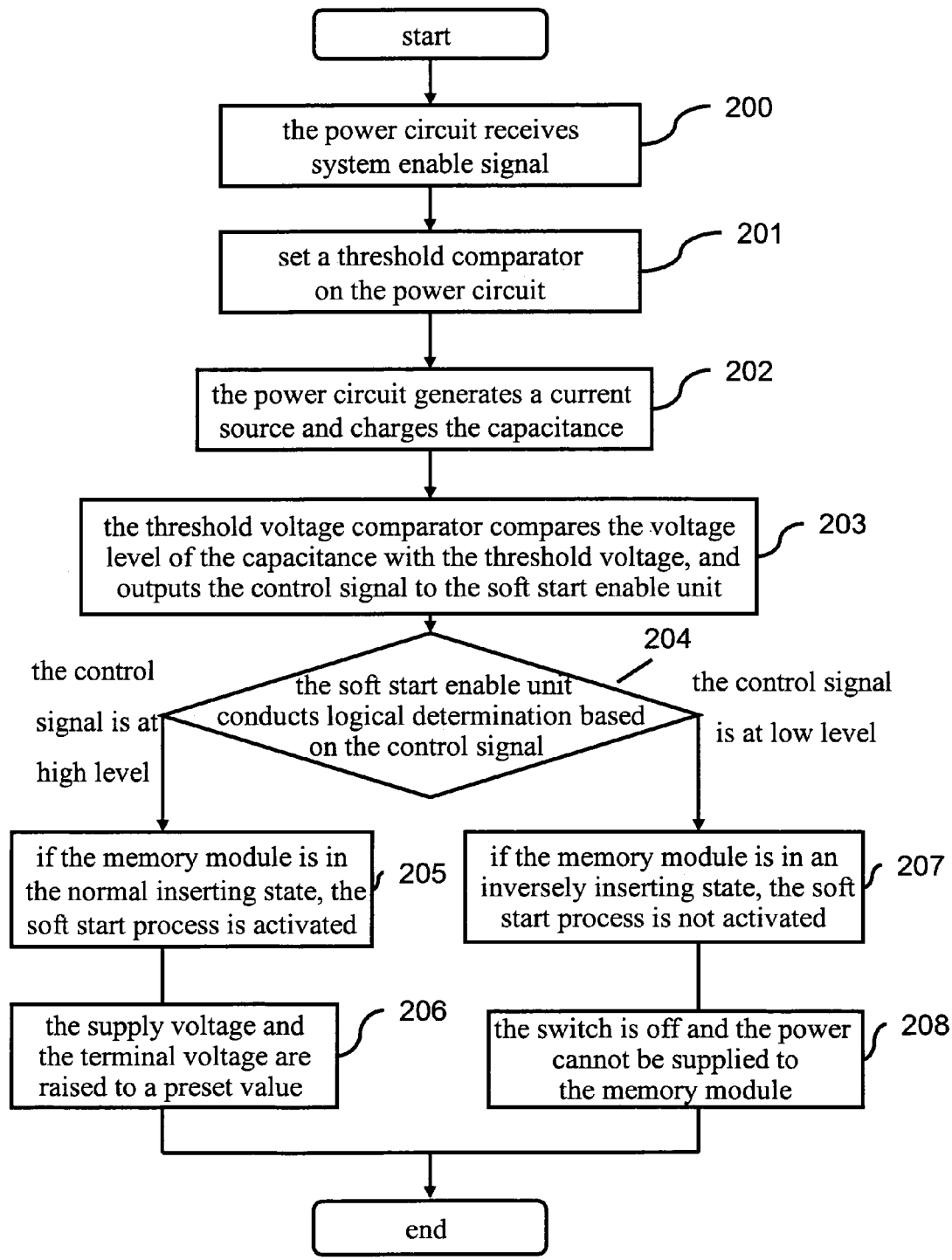
FIG. 4 is a flow diagram of the steps of the protection method for the memory module of the present invention.

With reference to FIG. 4, which is a flow diagram of the steps of the protection method for the memory module of the present invention, it comprises the following steps. First, the power circuit receives system enable signals (step 200). Set a threshold voltage comparator on the power circuit (step 201). The power circuit generates a current source and charges the capacitance (that is the first capacitance C1) (step 202), said current source may be generated from the inside of the power chip, or be generated by the power chip controlling the first transistor switch Q1 or other manners, and the capacitance is connected on the slot loop of the memory module. Next, the threshold voltage comparator compares the voltage level of the capacitance with the threshold voltage signal, and outputs the control signal to the soft start enable unit 30 (step 203). The soft start enable unit 30 conducts logical determination based on the output control signal (step 204). When the control signal is at high level (said level is only for example, and is not limited to the high level), it represents that if the memory module is in the normal inserting state, and the soft start process is activated (step 205). Then, the supply voltage VDDQ and the terminal voltage VTT are raised to a preset value (step 206). When the control signal is at low level (said level is only for example, and is not limited to the low level), it represents that if the memory module is in an inversely inserting state, the soft start process is not triggered (step 207). Therefore, the switch is off and the power cannot be supplied to the memory module (step 208).

With the present protection circuit of a memory module and the method thereof, the memory module is protected by detecting whether said memory module is in the inversely inserting state, thereby to decide whether a power should be supplied to the memory module.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A protection circuit of a memory module, comprising:
   a first voltage comparing unit, for comparing a reference voltage signal and a capacitance voltage level signal, so as to output a first driving signal;
   a transistor switch, connected among the output terminal of the first voltage comparing unit and an input terminal of a second voltage comparing unit and a power end;
   the second voltage comparing unit, for comparing the capacitance voltage level signal and a threshold voltage signal, so as to output a second driving signal;
   a logical algorithm unit, for conducting a logical algorithm between the second driving signal and a system enable signal, so as to output a third driving signal; and
   a soft start enable unit, for receiving the third driving signal to enable a soft start process.

2. The protection circuit as set forth in claim 1, further comprising:
   a current source, connected to the transistor switch; and
   a capacitor, with one end connected to the transistor switch and the other end connected to the ground.

3. The protection circuit as set forth in claim 2, wherein the capacitance is charged by the current source to give said voltage level signal.

4. The protection circuit as set forth in claim 1, wherein the transistor switch is a metal semiconductor transistor switch or other types of transistor switch.

5. The protection circuit as set forth in claim 1, wherein the power end supplies a power to the memory module when the transistor switch is on.

6. The protection circuit as set forth in claim 1, wherein the power end is incapable of supplying a power to the memory module when the transistor switch is off.

7. A protection method for a memory module, comprising:
   providing a current source to a capacitor connected to a slot loop of the memory module;
   setting a threshold voltage comparator having a threshold voltage signal input and connected to the capacitor;
   charging the capacitor through a current source, to give a voltage level signal; and
   deciding whether to activate a soft start process after comparing the voltage level signal with the threshold voltage signal through the threshold voltage comparator.

8. The protection method as set forth in claim 7, wherein after the threshold voltage comparator compares the voltage level signal with the threshold voltage signal, the switch is off, so that a power is incapable of being supplied to the memory module.

9. The protection method as set forth in claim 7, wherein said transistor switch is a metal semiconductor transistor switch or other types of transistor switch.

* * * * *